United States Patent [19]

Bonazza

[11] Patent Number: 4,880,679
[45] Date of Patent: Nov. 14, 1989

[54] EMI SHIELDED PLASTIC COMPOSITES

[75] Inventor: Benedict R. Bonazza, Bartlesville, Okla.

[73] Assignee: Phillips Petroleum Company, Bartlesville, Okla.

[21] Appl. No.: 173,230

[22] Filed: Mar. 25, 1988

[51] Int. Cl.$^4$ .................. B29C 65/00; B32B 31/00
[52] U.S. Cl. .................................. 428/57; 156/273.7; 156/273.9; 156/275.1; 156/304.1; 156/304.3; 156/304.6; 428/58; 428/61; 428/77; 428/78; 428/189; 428/190; 428/223; 428/236; 428/238; 428/239; 428/251; 428/256; 428/285; 428/286; 428/419
[58] Field of Search ............... 428/57, 58, 61, 77, 428/78, 189, 190, 223, 236, 238, 239, 251, 256, 285, 286, 419; 156/273.7, 273.9, 275.1, 304.1, 304.3, 304.6

[56] References Cited

U.S. PATENT DOCUMENTS

| 4,471,015 | 9/1984 | Ebneth et al. | 428/195 |
| 4,554,204 | 11/1985 | Ono et al. | 428/246 |
| 4,617,231 | 10/1986 | Hamada et al. | 428/297 |

OTHER PUBLICATIONS

Electrically Conductive Fillers and Reinforcements Plastics Compounding, Jan./Feb. 1980, pp. 19-33.

Primary Examiner—Marion C. McCamish
Attorney, Agent, or Firm—Richmond, Phillips, Hitchcock & Umphlett

[57] ABSTRACT

The conductance between conductive fibers utilized in a composite panel and the surface of the panel is improved by the use of conductive inserts which are pressed into the surface of the panel sufficiently to contact the fibers facilitating electrically connecting the conductive fibers with a ground on the conductive fibers in another panel.

20 Claims, 1 Drawing Sheet

U.S. Patent
Nov. 14, 1989
4,880,679
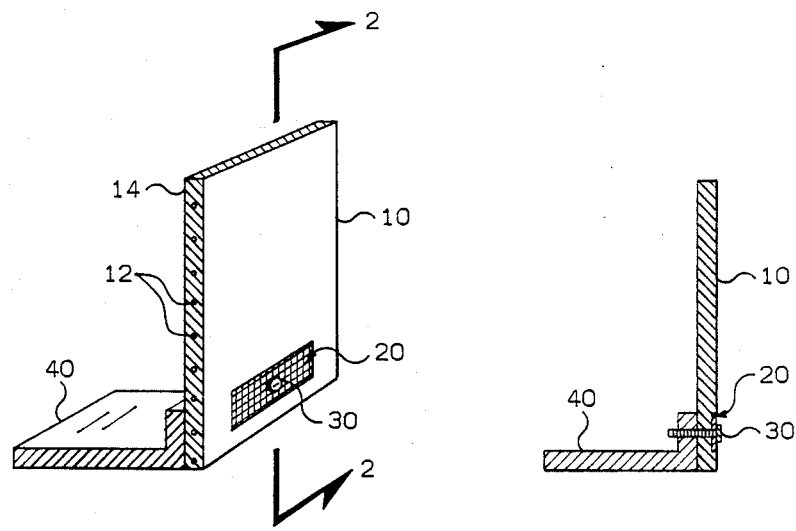
FIG. 1
FIG. 2
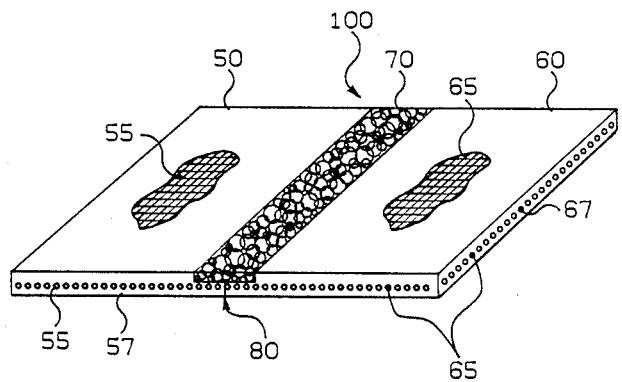
FIG. 3

EMI SHIELDED PLASTIC COMPOSITES

BACKGROUND OF THE INVENTION

This invention relates to establishing electrical conductance between a plastic composite and another article.

To provide effective electromagnetic interference (hereinafter EMI) shielding, a material should be conductive and should also be well grounded. An electronics cover made of metal is easily grounded and the contact resistance between the cover and a metal main frame is inherently low. However, an electronics cover made of a plastic material which is made conductive by the use of conductive fibers or wires and the like is not easily grounded. The problem arises because there is an insufficient amount of the conductive fiber on the surface of the material to provide effective grounding, resulting in high contact resistance and poor shielding by the part. It would be extremely desirable to provide a technique to obtain effective grounding between a composite part containing conductive fibers and a metal part, or between two different composite parts each containing conductive fibers.

OBJECTS OF THE INVENTION

It is an object of this invention to provide a plastic composite article which is easily grounded such as by use of an electrically conductive fastening device.

It is another object of this invention to provide a process for electrically grounding a composite article containing conductive fibers.

It is another object of this invention to provide a process for joining plastic composite articles containing conductive fibers in such a manner that good conductance is provided between the articles.

It is yet another object of this invention to provide a process for joining plastic composite articles in such a manner to provide for good electrical continuity between the articles.

SUMMARY OF THE INVENTION

In a first embodiment of the invention, there is provided a plastic article containing conductive fiber reinforcement which is characterized by a fusion line and an electrically conductive insert embedded into the surface of the article along the fusion line sufficiently to establish an electrical flow path of low resistance between the subparts of the article which are separated by the fusion line. By this technique, there is provided a method for fusing together thermoplastic articles such as sheets or panels containing electrically conductive fibers to provide conductance between the sheets and thus good EMI shielding by the product of the fusion.

In another embodiment of the invention, there is provided a process for forming the above mentioned article. In the process, a first subpart containing conductive fibers in a plastic matrix is contacted with a second subpart containing conductive fibers embedded in a plastic matrix along a contact line. The two subparts are fused together along the contact line. An electrically conductive insert crossing the line of fusion is embedded into the two subparts sufficiently to contact the conductive fibers therein and establish a highly conductive pathway between the subparts. For thermoplastic matrices, the process can be practiced quickly and easily in a mold press.

In another embodiment of the invention, there is provided a process for embedding an electrically conductive insert in a plastic composite article containing conductive fibers in a continuous thermoplastic matrix in such a manner as to provide conductivity between the fibers inside of the article and the surface of the article. The process is practiced by heating a portion of the article sufficiently to soften the thermoplastic matrix and pressing the electrically conductive insert into the thus softened matrix sufficiently to contact the conductive fibers therein. The resulting article is usefully employed in computer housings, for example, where it can be grounded to a metallic frame by inserting a fastener through the article in the location of the electrically conductive insert so as to contact the insert.

In yet another embodiment of the invention, there is provided an article comprising a plastic composite having electrically conductive fibers therein and an electrically conductive insert partly set into the article and forming a portion of the surface of the article, said electrically conductive insert being sunk into the article sufficiently to contact the conductive fibers therein, thereby establishing a conductive pathway between the fibers and the surface of the article.

BRIEF DESCRIPTION OF THE DRAWINGS

In the drawings forming a part hereof, wherein like reference characters denote like parts in the various views.

FIG. 1 illustrates partly schematically, certain features of one embodiment of the invention.

FIG. 2 is a cross-sectional view of the article shown in FIG. 1 when viewed along the indicated lines.

FIG. 3 is a pictorial representation of another embodiment of the present invention with portions of the surface of the object removed to shown internal details.

DETAILED DESCRIPTION OF THE INVENTION

The articles 10 (FIG. 1) and 100 (FIG. 3) each comprise electrically conductive fibers 12 (FIG. 1), 55 and 65 (FIG. 3) embedded in a continuous thermoplastic matrix 14 (FIG. 1), 57 and 67 (FIG. 3) and an electrically conductive insert 20 (FIG. 1) or 70 (FIG. 3) embedded in the matrix to establish electrical continuity between the electrically conductive fibers and the surface of the article.

The matrix material is preferably a thermoplastic because embedding the electrically conductive insert in a thermoplastic resin or composite is easier to control than embedding the electrically conductive insert in a thermoset resin or composite. Suitable thermoplastic matrices can be selected from the group consisting of polyethylene, polypropylene, polyester, polyamide, polystyrene, acrylonitrile butadiene styrene (ABS), acrylic polymer and copolymers, polyethers, polyamides, polyvinylchlorides, polycarbonates, polysulphones, polyketones, poly(ether.ether ketone), (PEEK), and poly(arylene sulfide) resins. Preferably, the matrix material comprises a poly(arylene sulfide) resin selected from the group consisting of poly(phenylene sulfide), poly(phenylene sulfide phenylene sulfone), commonly called poly(phenylene sulfide sulphone), (PPSS), poly(phenylene sulfide phenylene ketone), commonly called poly(phenylene sulfide ketone), (PPSK) and poly(biphenylene sulfide) (PBPS). The most preferred resin to use in forming the matrix comprises a poly(phenylene sulfide) because composites containing matrixes formed from this resin have been tested with good results. The most preferred poly(phenylene sulfide) comprises poly(p-phenylene sulfide) such as is sold under the trademark Ryton ® PPS, from Phillips 66 Company, Bartlesville, Okla. 74004.

The electrically conductive fibers embedded in the continuous thermoplastic matrix can be selected from a wide variety of materials. Generally speaking, the electrically conductive fibers will comprise metal whiskers or wires or fibers which contain a metal or metal alloy. When the metal whiskers, wires or fibers have a sufficiently high aspect ratio (the average length:diameter ratio, L/D), is is possible to utilize very low levels of metal in the article resulting in weight and cost savings. The metal whiskers, wires or fibers will often be in the form of a network, for example, in the form of a fabric, a screen, or a mat. Usually, the wavelength to be shielded by the composite article will have a length that is generally greater than about 30 centimeters so that the network formed by the whiskers, wires or fibers may contain some open areas having a size up to about one square centimeter and still provide adequate shielding. Various conductive metals or metal alloys are suitable for forming the whiskers, wires or fibers. The metals which can be used for electrical conductors are suitable, such as, fòr example, aluminum, copper, silver or gold. Other metals, such as nickel, tin, and lead are also expected to work well, provided that the resins selected for the matrix material do not undesirably interact with the metal selected, such as by corrosion. The preferred material to utilize as the electrically conductive fibers is in the form of metallized carbon fibers, such as nickel coated carbon fibers, as are commercially available.

The diameter of the electrically conductive fibers is not particularly important. However, it is desirable that the length:diameter ratio of the fibers be greater than about 20 to provide a high aspect ratio and good effectiveness for EMI shielding. Thinner whiskers, wires or fibers provide adequate EMI shielding at lower cost and with weight savings are preferred.

The thickness and form of the article containing the conductive whiskers, wires or fibers is not particularly important. However, for thermoplastics, it is advantageous that the article be in the form of a sheet or panel so that it can be subsequently thermoformed to any desired shape. The thickness of the sheet should be, depending on the amount of reinforcement present, sufficient to provide the desired degree of structural strength. For computer housings for example, it is anticipated that the sheets or panels will have a thickness in the range of from about 0.1 millimeters up to about 10 millimeters. Nonconductive fibers can also be present in the article to provide the requisite degree of reinforcement. Generally speaking, the article will contain in the range of from about 5% up to about 95% by weight of the electrically conductive fibers and in the range of from about 95% by weight to about 5% by weight of the plastic resin. The resin and the fibers can be brought together and consolidated using techniques known in the art, for example, by sandwiching the reinforcement and/or the conductive fibers between films of the thermoplastic resin and applying sufficient heat and pressure to melt the resin and wetout the fibers, thus, after cooling and recovery forming an EMI shielded sheet.

The electrically conductive insert 20 (FIG. 1) or 70 (FIG. 3) is at least partially embedded in the thermoplastic matrix 14 (FIG. 1), 57 and 67 (FIG. 3) to contact the reinforcing fibers 12 (FIG. 1), 55, and 65 (FIG. 3) and establish an electrical flow path from the electrically conductive fibers to the surface of the article. Preferably, the electrically conductive insert is formed by whiskers, wires or fibers, such as whiskers, wires or fibers in the form of a mat, a fabric, or a screen. The item 20 (FIG. 1) or 70 (FIG. 3) is preferably sunk into the surface of the EMI shielded article, preferably mounted flush with the surface, which facilitates fabrication in a mold press. For thermoplastics, this is rather easily accomplished by heating the conductive object and/or the matrix therebeneath sufficiently to soften the matrix while urging the object into the matrix deep enough to contact the conductive fibers. As is shown by electrically conductive insert 20 (FIG. 1) or 70 (FIG. 3), conductively around a large zone or area can be established by such an insert.

In the embodiment of the invention shown in FIGS. 1 and 2, the EMI shielded article 10 is grounded to a means 40 for providing an electrical ground by a fastener 30 which extends through the object 10 in the location of the insert 20. The fastener 30, preferably a screw or the like, is formed from a conductive material so that an electrical flow path is provided between the electrically conductive fibers in the EMI shielded sheet or panel and the ground means 40.

In the embodiment of the invention shown in FIG. 3, the insert 70 establishes an electrical flow path between a first subpart 50 of an article 100 and a second subpart 60 thereof. The subparts are preferably in the form of sheets or panels, and are contacted edge to edge along a contact line prior to the application of sufficient heat and pressure to fuse them together in a fusion line. The subparts 50 and 60 are joined together along a fusion line 80 with the insert 70 being positioned across the fusion line to establish continuity between the electrically conductive fibers 55 in the first subpart 50 and the electrically conducted fibers 65 and the second subpart 60. The insert 70 is preferably formed from a network of electrically conductive fibers and is pressed into the softened thermoplastic resin after heat softening, along the fusion line to contact the conductive fibers in the first subpart and the second subpart and establish an electrical flow path between the subparts. In the case of poly(arylene sulfide) resin, it is necessary to first heat the resin to above the softening point thereof, which is in excess of 500° F. for poly(arylene sulfides).

The invention is further illustrated by the following example.

EXAMPLE

Two parallel one-inch strips of Fibrex nickel fiber mat from Natioal Standard were pressed into a nine inch long poly(phenylene sulfide panel containing nickel coated carbon fibers and sold under the tradename AN 10-20 by Phillips 66 Company of Bartlesville, Okla. 74004 near the ends thereof. The panel was approximately ⅛ inch thick and 4 to 5 inches wide. The nickel fiber mat was pressed into the composite panel with a press utilizing a platen temperature of 615° F. and contact pressure and were driven in flush with the face of the panel. Surface resistance measurements were then made on the face of the panel. Instrument readings taken from nickel strip to nickel strip were in the range of 20 to 50 milliohms and very steady relatively independent of location on the strip. Instrument reading on the face of the panel at positions about 9 inches apart and not on the strips were in the range of 500 milliohms to 1 ohm, very erratic and location dependent. This simple experiment demonstrates the nickel fiber strips provided good contact with the conductive mat in the composite, and also provided a good conductive area on the surface of the panel for grounding to other items.

This invention has been described in detail for the purpose of illustration, it is not to be construed or limited thereby, but is intended to cover all changes and modifications within the spirit and scope thereof.

That which is claimed is:

1. An article comprising a first subpart characterized by electrically conductive fibers embedded in a continuous plastic matrix and a second subpart characterized by electrically conductive fibers embedded in a continuous plastic matrix, said subparts being joined together along a fusion line, and an electrically conductive insert embedded in said first subpart and said second subpart along the fusion line which contacts the electrically conductive fibers in the first subpart and the second subpart and establishes continuity between the electrically conductive fibers in the first subpart and the electrically conductive fibers in the second subpart.

2. An article as in claim 1 wherein the plastic matrix comprises a thermoplastic matrix and the electrically conductive insert comprises electrically conductive wires or fibers in the form of a mat, a fabric or a screen.

3. An article as in claim 2 wherein the electrically conductive fibers or wires extending across the fusion line are sunk into the surfaces of the subparts.

4. An article as in claim 3 wherein the electrically conductive fibers or wires are selected from the group consisting of metal whiskers, metal wires, metal fibers, metallized fibers, and carbon fibers.

5. An article as in claim 4 wherein the thermoplastic matrix of the subparts is selected from the group consisting of polyethylene, polypropylene, polyester, polyamide, polystyrene, acrylonitrile-butadiene-styrene polymers, acrylic polymers and copolymers, polyethers, polyamides, polyvinylchlorides, polycarbonates, and poly(arylene sulfide)s.

6. An article as in claim 4 wherein the thermoplastic matrix comprises a poly(arylene sulfide) selected from the group consisting of poly(phenylene sulfide), poly(phenylene sulfide phenylene sulfone), poly(phenylene sulfide phenylene ketone), and poly(biphenylene sulfide).

7. An article comprising a continuous plastic matrix containing electrically conductive fibers and having an electrically conductive insert forming a portion of the surface of said article, said electrically conductive insert being sunk into said article so as to contact the electrically conductive fibers therein and establish continuity between the electrically conductive fibers and the surface of said object.

8. An article as in claim 7 wherein the electrically conductive insert is embedded in the surface of the article and contains carbon fibers or metal.

9. An article as in claim 8 further comprising a fastener extending through the article, said fastener being formed from an electrically conductive material and having a head portion which contacts the electrically conductive insert and a shank portion which is connected to a means for grounding said fastener.

10. An article as in claim 8 wherein the insert embedded into the surface of the article is selected from the group consisting of electrically conductive fibers or wires in the form of a mat, a fabric, or a screen.

11. An article as in claim 10 wherein the thermoplastic matrix comprises a poly(arylene sulfide) and the conductive fibers or wires comprise metallized carbon fibers.

12. An article as in claim 11 wherein the thermoplastic matrix comprises a poly(phenylene sulfide).

13. A process for connecting a first subpart containing electrically conductive fibers in a continuous thermoplastic matrix with a second subpart containing electrically conductive fibers in a continuous thermoplastic matrix to form an article, said process comprising
contacting said first thermoplastic subpart with said second thermoplastic subpart along corresponding edges of the first subpart and the second subpart;
bridging the contacting edges of the first subpart and the second subpart with an electrically conductive object;
heating said first subpart and said second subpart along said contacting edges sufficiently to soften the thermoplastic matrix of the first subpart and the second subpart;
fusing the first subpart to the second subpart along the contacting edges;
pressing the electrically conductive object into the softened thermoplastic matrix along the contacting edges sufficiently to establish electrical continuity between the electrically conductive fibers in the first subpart and the electrically conductive fibers in the second subpart; and
cooling the resulting article.

14. A process as in claim 13 wherein the electrically conductive objective comprises a network of electrically conductive fibers or wires.

15. A process as in claim 14 wherein the electrically conductive fibers embedded in the continuous thermoplastic matrix comprise metallized carbon fibers and the network of conductive fibers or wires comprises a mat, a fabric, or a screen.

16. A process as in claim 13 wherein the thermoplastic matrix comprises a poly(arylene sulfide) and the first subpart and the second subpart are heated at a temperature of at least 500° F. in order to soften the matrix sufficiently to fuse the first subpart to the second subpart.

17. A process as in claim 16 wherein the first subpart and the second subpart are in the form of sheets.

18. A process comprising
(a) heating at least a portion of an article containing electrically conductive fibers in a continuous thermoplastic matrix sufficiently to soften the continuous thermoplastic matrix;
(b) embedding an electrically conductive insert in the thus softened thermoplastic matrix sufficiently to establish electrical continuity between the electrically conductive fibers embedded in the continuous thermoplastic matrix and the thus embedded insert; and
(c) cooling the article containing the thus embedded insert.

19. A process as in claim 18 further comprising positioning said article adjacent to an electrically grounded metal object and inserting an electrically conductive fastener through said article and into said electrically grounded metal object in a manner so that said fastener contacts a portion of the electrically conductive insert embedded in the article, thereby establishing electrical conductance between the conductive fibers embedded in the article and the grounded object.

20. A process as in claim 19 wherein the article comprises electrically conductive fibers in a continuous poly(arylene sulfide) matrix and the insert embedded in said article contains an electrically conductive metal.

* * * * *